US 12,309,936 B2

(12) United States Patent
Morikawa et al.

(10) Patent No.: US 12,309,936 B2
(45) Date of Patent: May 20, 2025

(54) PALLET REPLACING DEVICE

(71) Applicant: FUJI CORPORATION, Chiryu (JP)

(72) Inventors: Shunji Morikawa, Toyoake (JP);
Tomoharu Yoshino, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 451 days.

(21) Appl. No.: 17/764,279

(22) PCT Filed: Sep. 30, 2019

(86) PCT No.: PCT/JP2019/038651
§ 371 (c)(1),
(2) Date: Mar. 28, 2022

(87) PCT Pub. No.: WO2021/064838
PCT Pub. Date: Apr. 8, 2021

(65) Prior Publication Data
US 2022/0346295 A1    Oct. 27, 2022

(51) Int. Cl.
*H05K 13/08*    (2006.01)
(52) U.S. Cl.
CPC .................. *H05K 13/086* (2018.08)
(58) Field of Classification Search
CPC .................................................. H05K 13/086
See application file for complete search history.

(56) References Cited

U.S. PATENT DOCUMENTS 5,870,820 A * 2/1999 Arakawa ............... H01L 24/799
901/6
6,199,272 B1 * 3/2001 Seto .................... H05K 13/0434
29/740
(Continued)

FOREIGN PATENT DOCUMENTS

JP          10-144768 A      5/1998
JP        2001-257257 A      9/2001
(Continued)

OTHER PUBLICATIONS

International Search Report mailed on Dec. 3, 2019 in PCT/JP2019/038651 filed on Sep. 30, 2019.

*Primary Examiner* — Saul Rodriguez
*Assistant Examiner* — Brendan P Tighe
(74) *Attorney, Agent, or Firm* — Oblon, McClelland, Maier & Neustadt, L.L.P.

(57) ABSTRACT

There is provided a pallet replacing device configured to be applied to a component supply device in which pallets, each holding components, are individually stored in multiple storage slots which are formed at predetermined heightward intervals inside a magazine, and the pallets are selectively drawn out to supply the components, the pallet replacing device, including a main body case, multiple replacing slots formed at the predetermined heightward intervals inside the main body case and configured to store the pallets therein, a positioning section configured to position the main body case in a predetermined position where the multiple pallets can individually move between the storage slots and the replacing slots, and a moving tool configured to be used for a batch moving operation for moving the multiple pallets altogether at one time between the storage slots and the replacing slots.

15 Claims, 10 Drawing Sheets

(56) References Cited

U.S. PATENT DOCUMENTS

| | | | |
|---|---|---|---|
| 6,370,765 B1* | 4/2002 | Hiramoto | H05K 13/021 414/331.14 |
| 2005/0276170 A1* | 12/2005 | Petrus Maria Vermeer | H05K 13/0434 369/30.84 |
| 2016/0143196 A1 | 5/2016 | Ishitani | |

FOREIGN PATENT DOCUMENTS

| JP | 2006-108299 A | 4/2006 |
|---|---|---|
| JP | 2010-199469 A | 9/2010 |
| JP | 2016-96260 A | 5/2016 |

* cited by examiner

PALLET REPLACING DEVICE

TECHNICAL FIELD

The present description relates to a pallet replacing device applied to a component supply device for supplying a component by drawing a pallet holding components from a magazine.

BACKGROUND ART

Examples of board work machines for manufacturing a board product on which a large number of components are mounted include a solder printer, a component mounter, a reflow machine, a board inspection machine, and the like. It is general practice to arrange these board work machines in a row to make up a board working line. In these board work machines, the component mounter generally includes a component supply device. As one system for such a component supply device, there is adopted a system in which multiple pallets, each holding components, are accommodated inside a magazine, and the pallets are selectively drawn out to supply the components. When the components held in the pallets are used up completely to leave none of them, or when a setup replacement operation is performed in association with a change in type of board products to be produced, the pallets are replaced. One technical example relating to the replacement of pallets of a component supply device is disclosed in Patent Literature 1.

Patent Literature 1 discloses a tray feeder including a rack section for holding a magazine accommodating multiple trays (pallets) and a tray moving section for removing the trays from the magazine to move the trays so removed to a component supply position. With this tray feeder, the whole of the magazine can be replaced. With this tray feeder, it is understood that the multiple pallets can be replaced altogether at one time, thereby making it possible to improve the work efficiency. On the other hand, a method is also adopted in which the pallets inside the magazine are manually replaced one by one.

PATENT LITERATURE

Patent Literature 1: JP-A-2016-96260

BRIEF SUMMARY

Technical Problem

Incidentally, the method of manually replacing pallets one by one requires some labor hours, eventually extending the work time. Further, in the event that a pallet is erroneously tilted in the middle of the replacement operation, there may be caused a possibility that the positions of components held therein deviate from their normal positions. In contrast with this, the technique disclosed in Patent Literature 1 is superior in improving the work efficiency. However, since the magazine filled with the pallets has a considerable weight, a replacing operation of magazines is not easy to perform in which a magazine is fed into the inside of the tray feeder.

A technical problem to be solved by the present description is how to provide a pallet replacing device for replacing multiple pallets holding components in efficient and ensured fashions.

Solution to Problem

According to the present description, there is disclosed a pallet replacing device configured to be applied to a component supply device in which pallets, each holding components, are individually stored in multiple storage slots which are formed at predetermined heightward intervals inside a magazine, and the pallets are selectively drawn out to supply the components, the pallet replacing device, including a main body case, multiple replacing slots formed at the predetermined heightward intervals inside the main body case and configured to store the pallets therein, a positioning section configured to position the main body case in a predetermined position where the multiple pallets can individually move between the storage slots and the replacing slots, and a moving tool configured to be used for a batch moving operation for moving the multiple pallets altogether at one time between the storage slots and the replacing slots.

In addition, according to the present description, there is disclosed a pallet replacing device configured to be applied to a component supply device in which pallets, each holding components, are individually stored in multiple storage slots which are formed at predetermined heightward intervals inside a magazine, and the pallets are selectively drawn out to supply the components, the pallet replacing device, including a main body case, multiple replacing slots formed at the predetermined heightward intervals inside the main body case and configured to store the pallets therein, a positioning section configured to position the main body case in a predetermined position where the multiple pallets can individually move between the storage slots and the replacing slots, and a moving mechanism configured to execute manually or automatically a batch moving operation for moving the multiple pallets altogether at one time between the storage slots and the replacing slots.

Advantageous Effects

With the pallet replacing device disclosed in the present description, when the positioning section positions the main body case in the predetermined position, the multiple pallets can move individually between the storage slots and the replacing slots. Then, the multiple pallets are moved altogether at one time by use of the moving tool or by operation of the moving mechanism. As a result, the replacement of the multiple pallets is performed efficiently. In addition, since each pallet only moves horizontally between the storage slot and the replacing slot and does not tilt, the replacement is executed in an ensured fashion.

DESCRIPTION OF EMBODIMENTS

Figure 1:
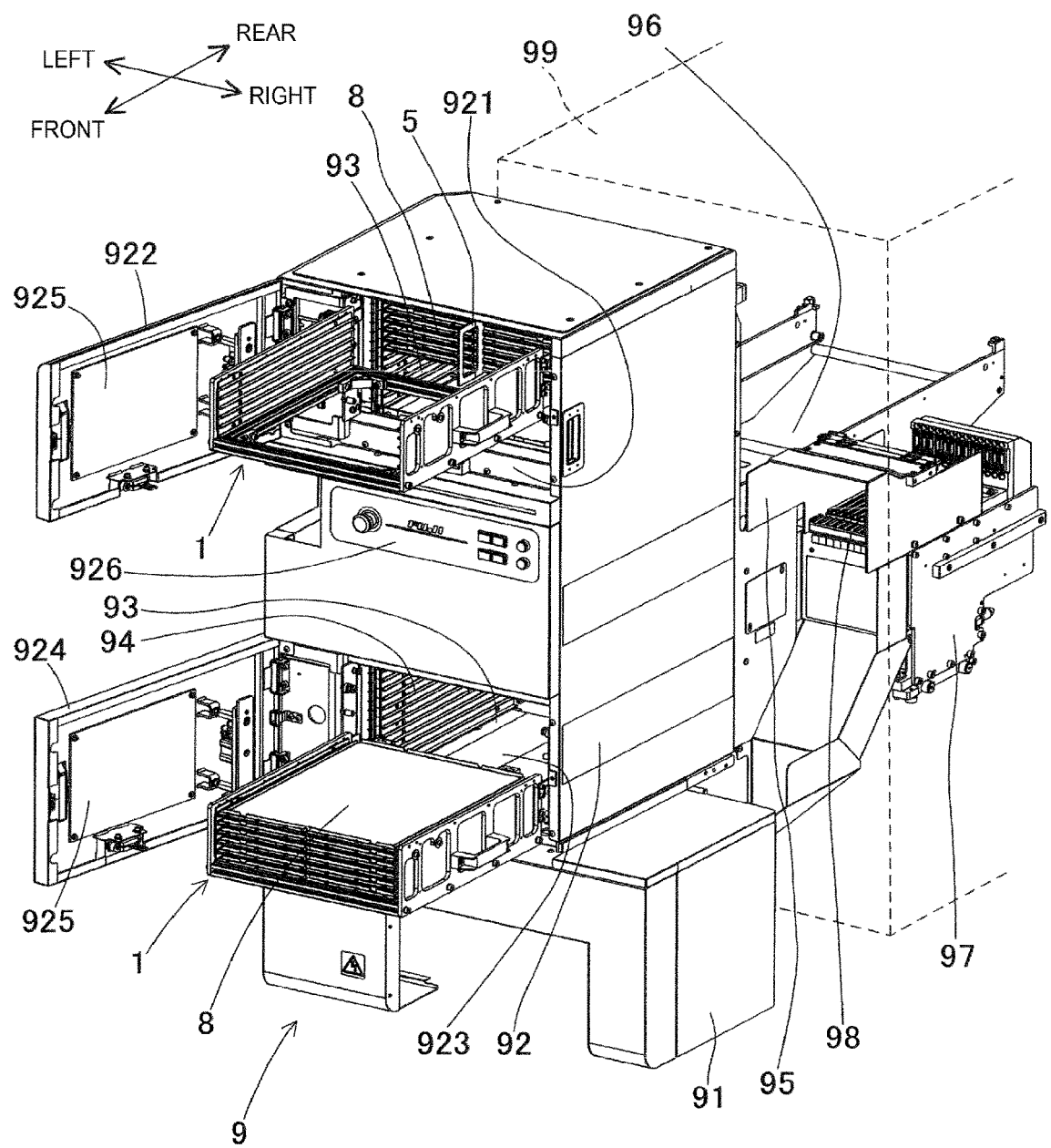
FIG. 1 is a perspective view showing a state in which two pallet replacing devices according to a first embodiment are attached to a component supply device.

1. Configuration of Component Supply Device 9

Firstly, component supply device 9, to which pallet replacing device 1 of a first embodiment is applied, will be described by reference to FIG. 1 and the like. The front, rear, left, and right of pallet replacing device 1 and component supply device 9 are defined as indicated by arrows in a top left corner of FIG. 1. Component supply device 9 is installed at a front side of component mounter 99 (refer to dashed lines in FIG. 1) for use. Component supply device 9 is such that pallets 8, each holding components, are stored individually in multiple storage slots which are formed at predetermined heightward intervals inside magazine 93 and that the pallets 8 are then selectively drawn out to supply the components. Component supply device 9 includes base 91, housing 92, magazines 93, draw-out mechanism 95, and the like, and feeder installation section 97 is additionally provided thereto.

Base 91 has a horizontally long box-like shape and is placed on a floor. Base 91 may be in the form of a bogie equipped with wheels. That is, component supply device 9 may be of a fixed type or a movable type. Housing 92 has a vertically long rectangular parallelepiped shape and is provided in such a manner as to be erected on base 91. Housing 92 has an upper door 922 for opening and closing opening section 921 provided in an upper portion of a front surface thereof. Further, housing 92 has a lower door 924 for opening and closing opening section 923 in a lower portion of the front surface thereof. Upper door 922 and lower door 924 are formed as one-sided doors which are supported on housing 92 along left edges thereof. Upper door 922 and the lower door 924 each have a viewing window 925 formed of transparent glass or resin, so that internal situations can be visually recognized.

Operation panel 926 is provided at a heightward position between upper door 922 and lower door 924 of housing 92. Operation panel 926 includes operation switches for inputting, for example, operation commands and operation modes, indicator lamps for indicating the operating status in opening sections 921, 923, and the like. A drawing opening (not shown) is opened in a rear surface of housing 92 generally at an intermediate height thereof.

Two upper and lower magazines 93 are accommodated inside housing 92. Magazine 93 is made up of a bottom surface portion and left and right side surface portions which extend upwards from both left and right edges of the bottom surface portion, respectively. 12 ledge-like portions 94, each extending in a front-rear direction, are provided on inner surfaces of the left and right side surface portions at predetermined heightward intervals in such a manner as to be directed inwardly so as to face each other. A separation distance between the left and right side surface portions is larger than a width dimension of substantially rectangular pallet 8. A separation distance between left and right ledge-like portions 94 is smaller than the width dimension of pallet 8.

Then, storage slots are defined individually between upper and lower ledge-like portions 94. The left and right storage slots at the same height make a pair for use. The number of storage slots is 12. Pallet 8 is stored in the corresponding storage slot in a horizontal state with its right edge placed on right ledge-like portion 94 and its left edge placed on left ledge-like portion 94. Intervals at which multiple pallets 8 are disposed in an up-down direction coincide with the heightward intervals at which ledge-like portions 94 are formed.

In FIG. 1, pallets 8 are stored in the first to sixth storage slots, as counted from the top, in upper magazine 93. On the other hand, lower magazine 93 is empty with no pallet 8 accommodated therein. Two magazines 93 are driven by a lifting and lowering mechanism, not shown, to be independently lifted up and lowered inside housing 92 and are also controlled so as not to collide with each other. As a result, pallet or pallets 8 are selected which are to be drawn out from the drawing opening in the rear surface of housing 92. As shown in FIG. 1, upper magazine 93 can be lifted up to a height position of upper door 922, and lower magazine 93 can be lowered to a height position of lower door 924.

Feeder installation section 97 is additionally provided rather rightwards on a rear side of base 91. Feeder installation section 97 includes multiple groove-shaped installation slots 98 which extend in a front-rear direction. A feeder (not shown) of a type configured to feed a carrier tape holding components is installed in each installation slot 98 in an exchangeable fashion. Feeder installation section 97 is not indispensable in the first embodiment and hence need not be provided together.

Draw-out mechanism 95 is provided at the rear of base 91 and housing 92 and is positioned at a left side of feeder installation section 97. Draw-out mechanism 95 draws out pallet 8 which is selected by lifting up or lowering magazine 93 accordingly from the storage slot to the drawing opening in the housing 92. Further, draw-out mechanism 95 conveys pallet 8 so drawn out to component supply position 96 located rather rearwards. Pallet 8 which completes the supply of a component in component supply position 96 is then returned to the original storage slot in magazine 93 by draw-out mechanism 95.

In use, a rear portion of draw-out mechanism 95 and a rear portion of feeder installation section 97 are inserted into component mounter 99. A component mounting tool of component mounter 99 picks up a component from pallet 8 and a feeder which are positioned in component supply position 96 and mounts the component so picked up on a board. Examples of the component mounting tool include a suction nozzle configured to pick up a component through a negative pressure, a holding type mounting tool, and the like.

Figure 3:
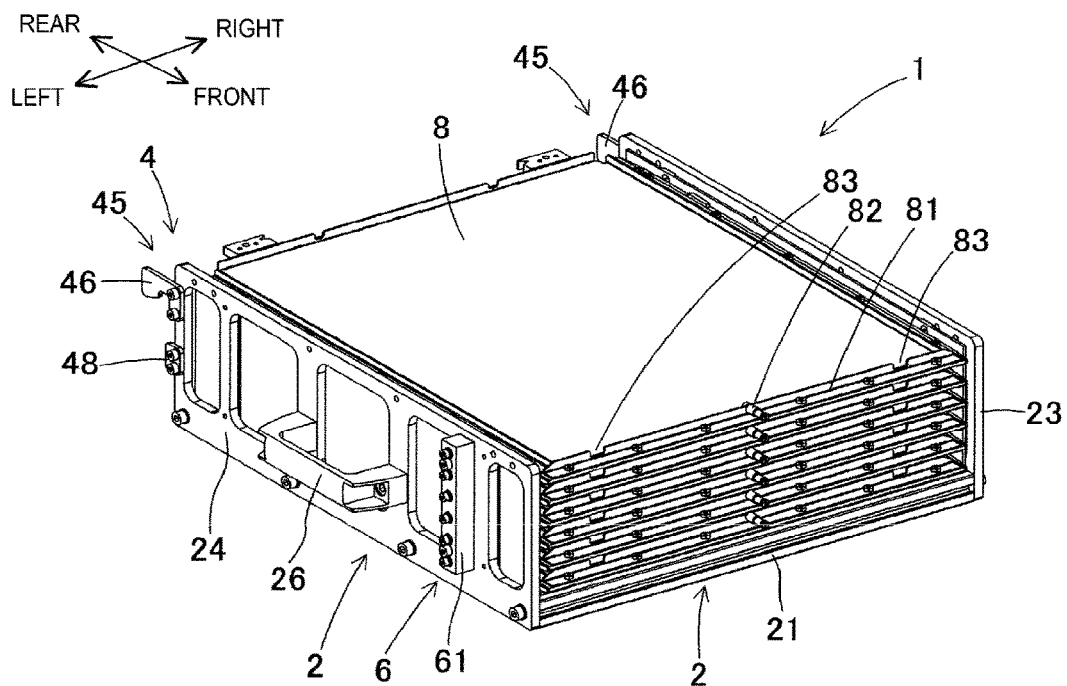
FIG. 3 is a perspective view of the pallet replacing device, which is fully loaded with pallets, as viewed from a different direction from the direction in which the pallet replacing device is viewed in FIG. 2.
Figure 10:
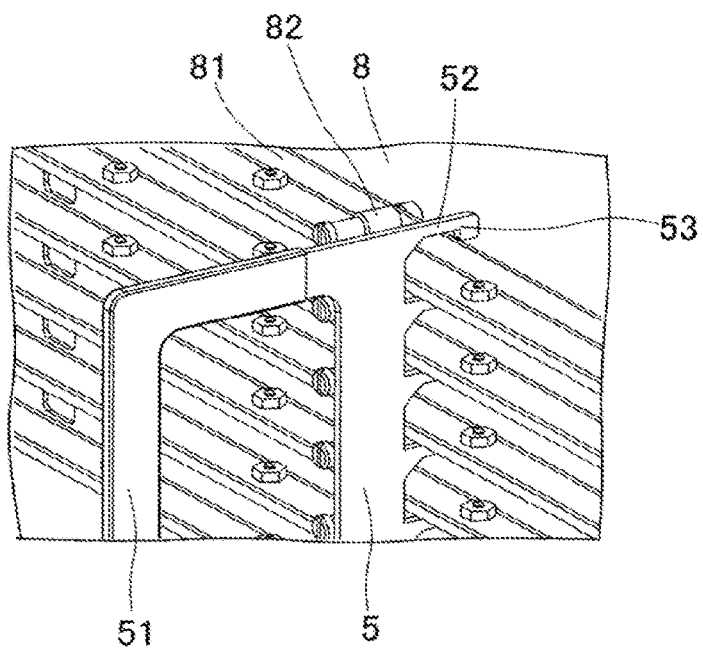
FIG. 10 is a partially enlarged view showing a state in which a moving tool is in engagement with the pallets.

Pallet 8 is formed using a rectangular plate-shaped member. As shown in FIGS. 3 and 10, locking section 81, extending in the left-right direction, is provided on an upper portion of a front edge of pallet 8. Locking section 81 has an L-shaped cross-section in which a front side is disposed horizontally and a rear side is disposed perpendicular. A front horizontal portion of locking section 81 is screwed to be fixed to pallet 8. The shape of locking section 81 is not limited to the shape described above, and hence, locking section 81 may be, for example, a hole bored in pallet 8. In addition, two locations on a perpendicular portion of locking section 81 are cut out to individually form passage portion 83 (refer to FIGS. 3, 15). Further, gripping member 82, having a stepped rod-like shape, is provided at a center of the front edge of pallet 8.

A holding metal tool (not shown) provided on an upper surface of pallet 8 holds a tray (not shown) in an exchangeable fashion. The tray has multiple component accommodation sections each configured to accommodate a component therein. The multiple component accommodation sections are arranged into a two-dimensional lattice-like configuration. In the event that pallet 8 is handled roughly or is tilted, there is caused a possibility that components accommodated in the component accommodation sections are caused to jump thereout to thereby be caused to deviate from their normal positions or to fall to outside pallet 8.

Pallet 8 itself may be formed into a tray-like shape having component accommodation sections. Alternatively, pallet 8 may hold an expandable sheet that can expand and contract. Multiple wafer components manufactured by cutting a semiconductor wafer are affixed to an upper surface of the expandable sheet. In this aspect, component supply device 9 has a mechanism for pushing up the expandable sheet and the wafer components in component supply position 96.

2. Configuration of Pallet Replacing Device 1 of First Embodiment

Next, the configuration of pallet replacing device 1 of the first embodiment will be described by reference to FIGS. 2 to 10. Pallet replacing device 1 is used for a recovery operation for recovering 12 pallets 8 accommodated in magazines 93 by drawing out a half of those 12 pallets 8 at one time. In addition, pallet replacing device 1 is also used for a storing operation for storing 6 replacing pallets 8 into magazine 93.

Figure 2:
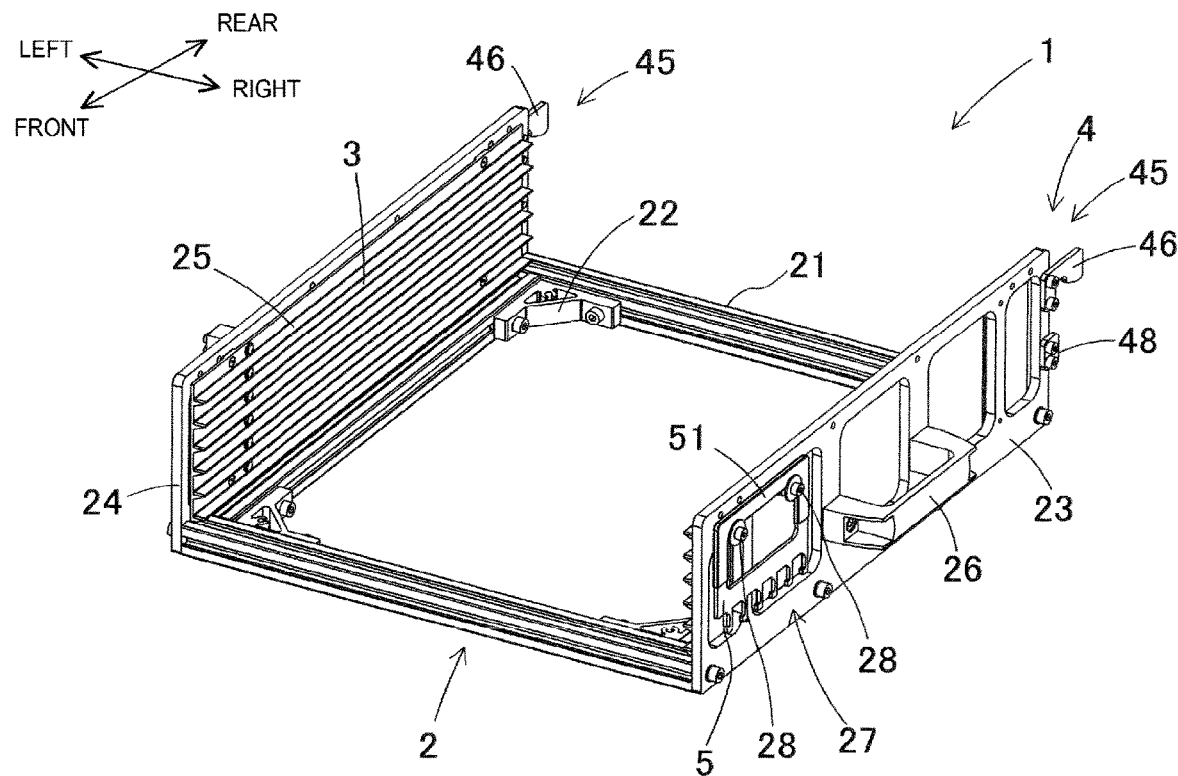
FIG. 2 is a perspective view of the pallet replacing device, which is empty with no pallet accommodated therein.

As shown in FIGS. 2 and 3, pallet replacing device 1 includes main body case 2, replacing slots 3, positioning sections 4, moving tool 5, and holding mechanism 6. Upper pallet replacing device 1 in FIG. 1 and pallet replacing device 1 in FIG. 2 are both empty with no pallet 8 accommodated therein. On the other hand, lower pallet replacing device 1 in FIG. 1 and pallet replacing device 1 in FIG. 3 are fully loaded with pallets 8 which are stored in all six replacing slots 3.

Main body case 2 is made up of bottom portion 21, right side surface portion 23, and left side surface portion 24. Bottom portion 21 is formed into a frame-like shape such as a picture frame by combining metallic square bars or the like. Bottom portion 21 has reinforcing members 22 for reinforcing the frame-like shape in four corners. Right side surface portion 23 and left side surface portion 24 are provided in such a manner as to extend upwards from right and left edges of bottom portion 21, respectively. Right side surface portion 23 and left side surface portion 24 are each formed by cutting out portions of a rectangular plate-shaped member. A reduction in weight of main body case 2 is realized by forming bottom portion 21 into the frame-like shape, cutting out the portions of right side surface portion 23 and left side surface portion 24, and omitting a top plate portion.

Figure 7:
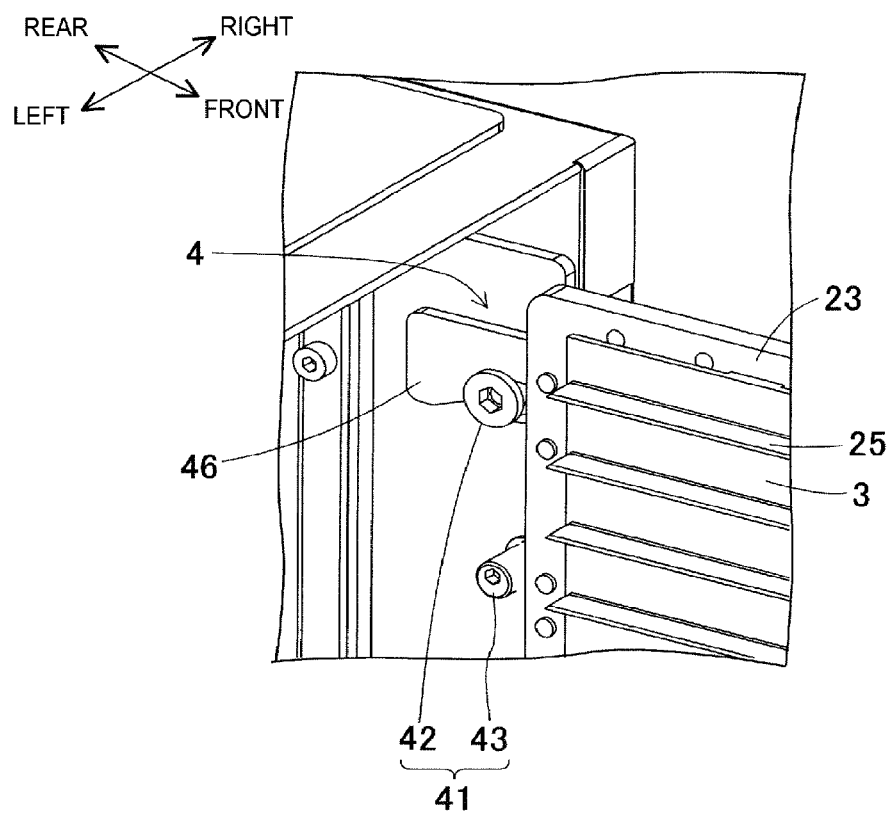
FIG. 7 is a perspective view showing a state in which an attachment portion of the main body case is attached to the attachment seat of the component supply device.

Six ledge-like portions 25, extending in the front-rear direction and disposed at predetermined heightward intervals, are provided individually on inner surfaces of right side surface portion 23 and left side surface portion 24 in such a manner as to be directed inwardly so as to face each other (refer to FIG. 7). Here, a separation distance between right side surface portion 23 and left side surface portion 24 is equal to a separation distance between left and right side surface portions of magazine 93. In addition, a separation distance between left and right ledge-like portions 25 is equal to a separation distance between left and right ledge-like portions 94 of magazine 93. Further, the heightward intervals at which ledge-like portions 25 are provided is equal to the heightward intervals at which ledge-like portions 94 are provided on magazine 93. That is, the configuration of the inside of main body case 2 is similar to the configuration of each of magazines 93 which are separated in housing 92 at a height which is a half of the height of housing 92.

Then, replacing slots 3 are each defined between upper and lower ledge-like portions 25. Left and right replacing slots 3 at the same height are used in pair so as to store pallet 8 therein. The number of replacing slots 3 is six. Pallet 8 is stored horizontally in replacing slots 3 with its right edge placed on right ledge-like portion 25 and its left edge placed on left ledge-like portion 25. The configurations of the storage slot and replacing slot 3 are not limited to those described above. For example, replacing slots 3 may be defined not by ledge-like portions 25 which are divided in the left-right direction but by multiple shelf plate members which are disposed at predetermined heightward intervals at a center in the left-right direction.

Handle 26 is provided in an intermediate position in the front-rear direction on an outer surface of each of right side surface portion 23 and left side surface portion 24. The operator can easily lift up and move pallet replacing device 1 by holding left and right handles 26. Tool accommodation section 27 is provided on right side surface portion 23 in a position lying further forwards than handle 26 (refer to FIG. 2). Tool accommodation section 27 is intended to accommodate moving tool 5 by hanging it therein. The operator can prevent moving tool 5 from being lost by making use of tool accommodation section 27.

Figure 9:
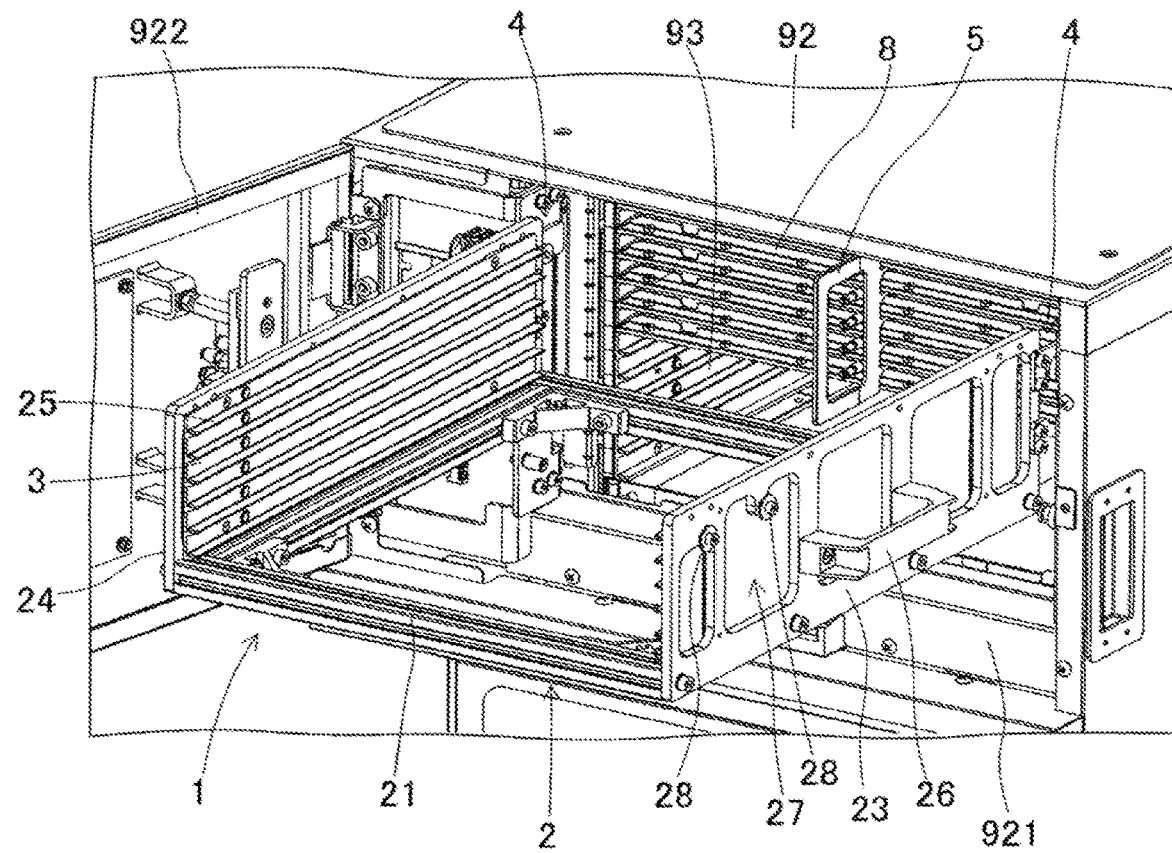
FIG. 9 is a perspective view illustrating a pallet draw-out operation with the empty pallet replacing device attached to the component supply device.

Moving tool 5 is such as to be used for a batch moving operation for moving multiple pallets 8 altogether at one time. As shown in FIGS. 9 and 10, moving tool 5 has a vertically long rectangular frame-like shape. A front portion, which is vertically long, of the frame-like shape constitutes a gripping portion 51 that the operator grips on. Six hooks 52, extending rearwards, are provided along a vertically long rear portion of the frame-like shape. Disposing intervals of those six hooks 52 in the up-down direction coincide with the disposing intervals of multiple pallets 8 inside magazine 93. Hooking portion 53, which is bent downwards, is provided at a rear end of each hook 52. Hooking portions 53 of six hooks 52 are brought into engagement with rear sides of perpendicular portions of locking sections 81 of six pallets 6 simultaneously. Moving tool 5 may have a structure in which moving tool 5 is brought into engagement with gripping member 82.

As shown in FIG. 2, tool accommodation section 27 of main body case 2 is formed by multiple headed screws 28 protruding rightwards from right side surface portion 23. Multiple head screws 28 each have a shaft section having a small diameter and a head section having a large diameter and are disposed in such a manner as to be spaced apart from one another in the front-rear direction. Moving tool 5 is oriented horizontally, so that gripping portion 51 is hooked on the shaft sections of headed screws 28. In addition, moving tool 5 is prevented from falling off by the head sections of headed screws 28. The structure and disposing position of tool accommodation section 27 is not limited to those described above. For example, tool accommodation section 27 may be a magnet section provided on main body case 2, so that moving tool 5 made of iron can be stored by attracting it with magnetic force.

Figure 4:
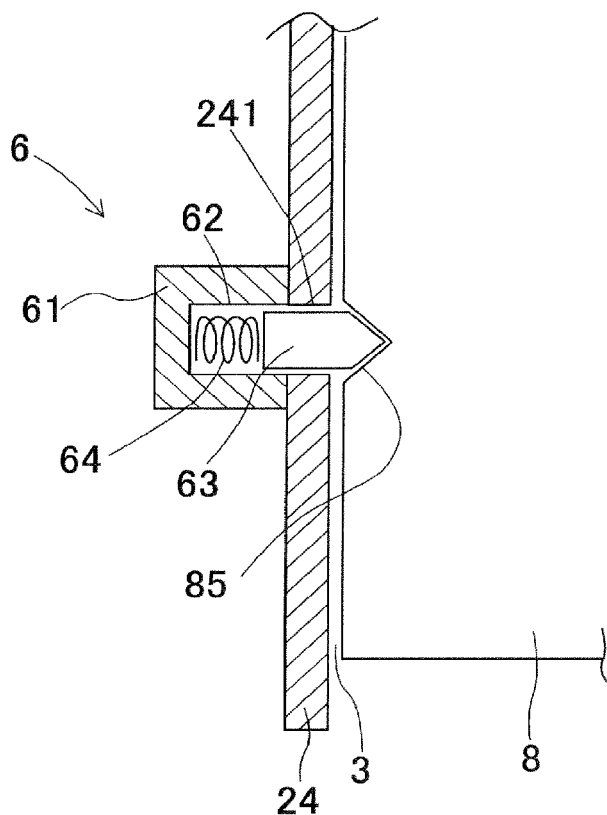
FIG. 4 is a plan sectional view schematically illustrating a holding mechanism provided on a main body case.

Holding mechanism 6 is provided in a position lying rather forwards on an outer surface of left side surface portion 24 (refer to FIG. 3). Holding mechanism 6 holds pallet 8 stored in replacing slot 3 to restrict pallet 8 from moving out from replacing slot 3. As shown in FIG. 4, holding mechanism 6 is made up of base material 61, holding member 63, and biasing spring 64. Base material 61 is formed long in the up-down direction and is attached to the outer surface of left side surface portion 24. Base material 61 has six holding holes 62 which are opened towards left side surface portion 24 in positions corresponding to the respective heights of six replacing slots 3. Left side surface portion 24 has through holes 241 formed in positions corresponding individually to holding holes 62.

Holding member 63 is disposed inside holding hole 62 and through hole 241. Holding member 63 is a rod-shaped member whose distal end facing replacing slot 3 is formed into a V-like shape. Biasing spring 64 is disposed between base material 61 and a rear end of holding member 63 within holding hole 62. Biasing spring 64 biases holding member 63 in such a manner that the distal end of biasing member 63 projects into a space in replacing slot 3. On the other hand, holding groove 85, having a V-like shape in section, is formed in a position lying rather forwards on a left surface of pallet 8.

When pallet 8 is stored in replacing slot 3, the left side surface of pallet 8 moves while pushing back holding member 63 towards base material 61 against the biasing force of biasing spring 64. When pallet 8 is stored in position, holding member 63 enters holding groove 85 for engagement therewith to thereby restrict pallet 8 from moving out from replacing slot 3 with the biasing force of biasing spring 64. As a result, even if main body case 2 is tilted, pallet 8 never moves out from replacing slot 3. The biasing force of biasing spring 64 is set so appropriately that the operator needs no excessively large force to remove pallet 8 from replacing slot 3.

Figure 5:
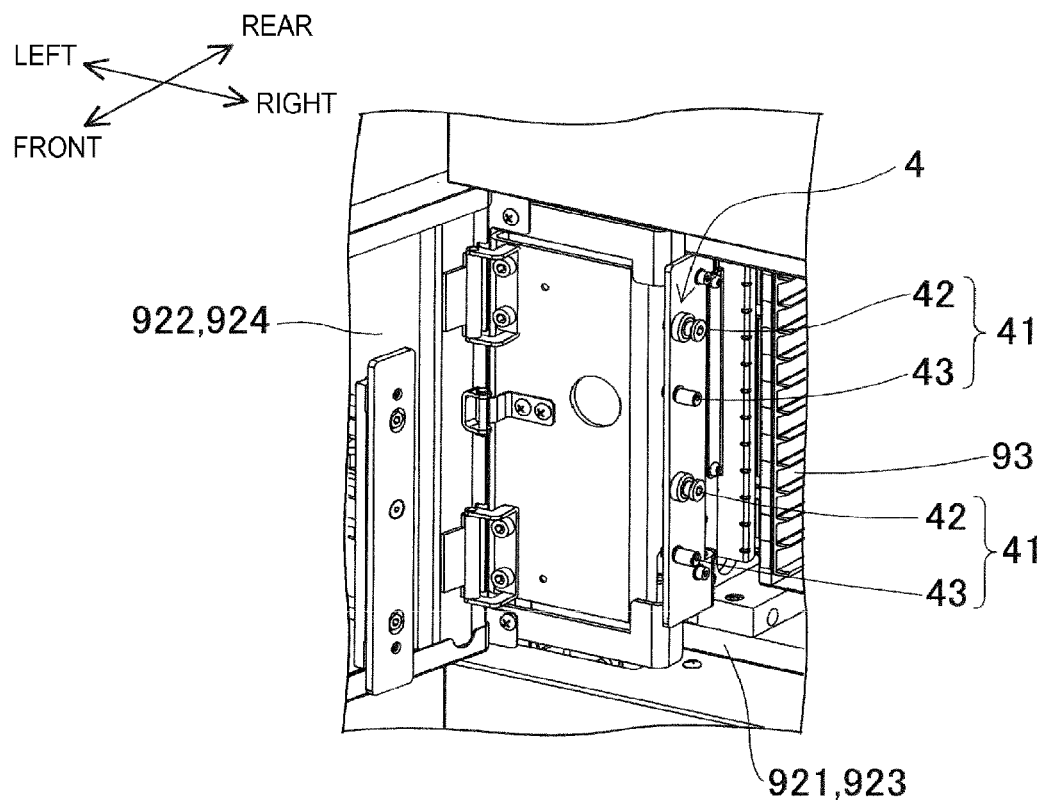
FIG. 5 is a perspective view showing an attachment seat provided rather leftwards on a front side of the component supply device.
Figure 6:
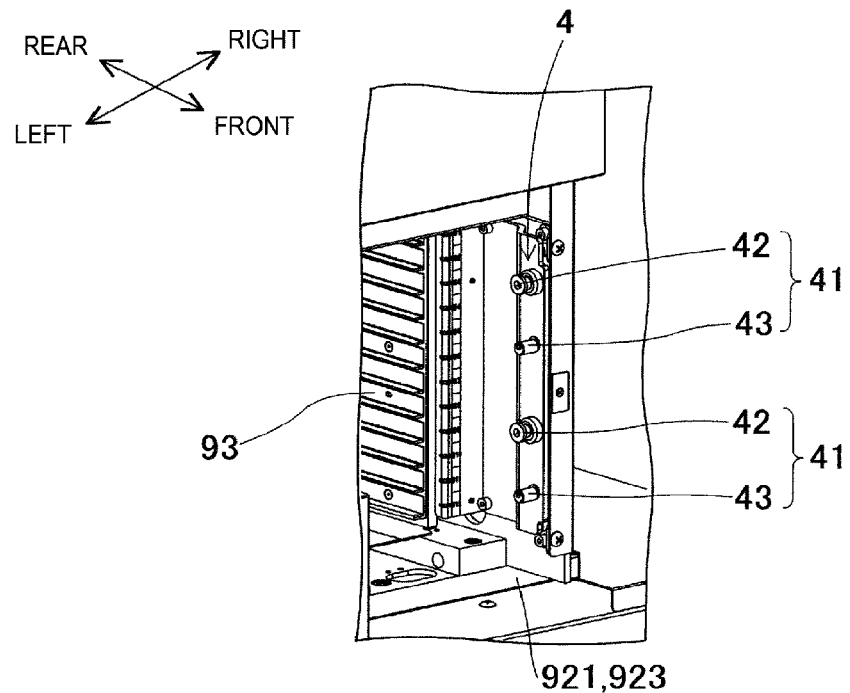
FIG. 6 is a perspective view showing an attachment seat provided rather rightwards on the front side of the component supply device.

Positioning section 4 positions main body case 2 in such a predetermined position that multiple pallets 8 can move individually between the storage slots and replacing slots 3. When positioned in the predetermined position, main body case 2 gets square to magazine 93. Positioning section 4 is made up of eight sets of attachment seats 41 provided in component supply device 9 and two sets of attachment portions 45 provided on main body case 2. As shown in FIGS. 5 and 6, two upper sets and two lower sets of attachment seats 41 are provided individually rather leftwards and rightwards on each of opening section 921 and opening section 923 of component supply device 9. As shown in FIGS. 2 and 3, two sets of attachment portions 45 are provided individually at a left end and a right end of a rear side of main body case 2.

Left and right attachment seats 41 on component supply device 9 are formed generally laterally symmetrical, in shape, with each other. For opening section 921 and opening section 923, upper attachment seats 41 are used for replacing first to sixth pallets 8 counted from the top in magazine 93, and lower attachment seats 41 are used for replacing seventh to twelfth pallets 8 counted from the top in magazine 93. Upper and lower attachment seats 41 have the same configuration. Each attachment seat 41 is made up of a holding target or held portion 42 and an eccentric pin 43.

Held portion 42 is a stepped shaft member which is attached in such a manner that an axial center thereof extends in the left-right direction. Eccentric pin 43 is provided below held portion 42 in such a manner as to define a space therebetween. Eccentric pin 43 is attached in such a manner that axials center C thereof extends in the left-right direction and constitutes an eccentric shaft member whose distance defined between axial center C and an outer circumferential surface thereof varies in a circumferential direction. A rotation angle of eccentric pin 43 is adjusted with a tool and rotates about axial center C. As a result, horizontal distance D (refer to FIG. 8) between axial center C and a front outer circumferential surface of eccentric pin 43 is adjusted.

Figure 8:
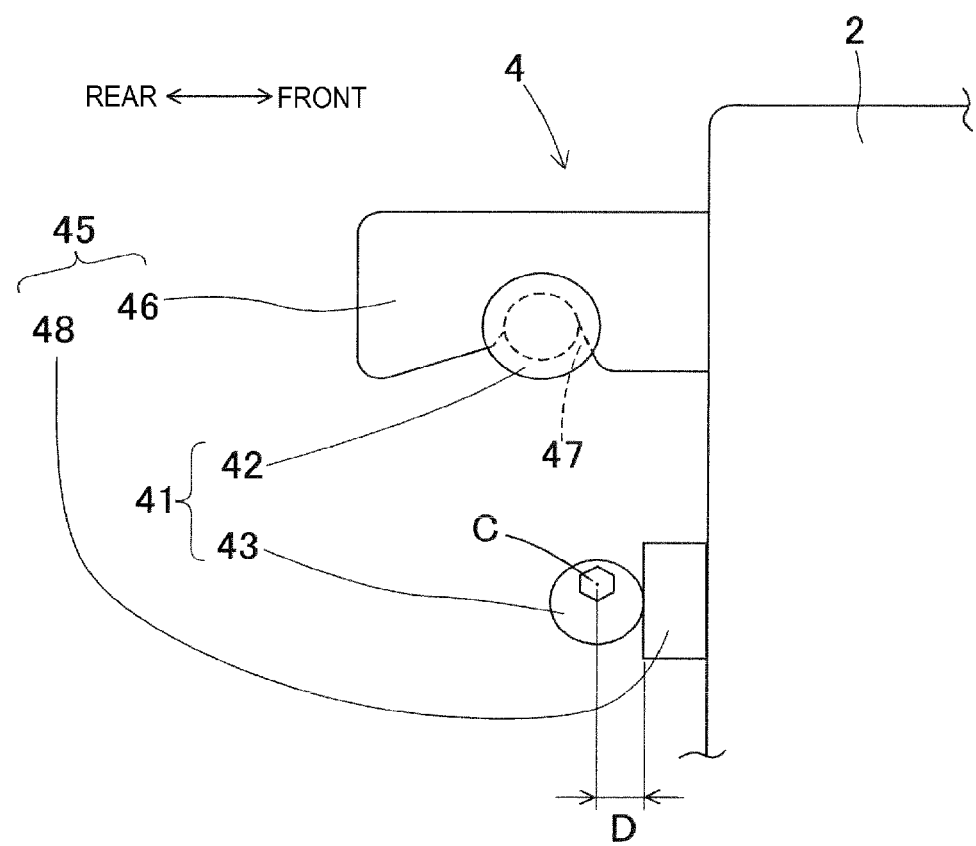
FIG. 8 is a partial side view showing a positioning section in the attached state in FIG. 7 in an enlarged fashion.

Left and right attachment portions 45 on the rear side of main body case 2 are configured generally laterally symmetrical with each other in shape. Each attachment portion 45 is made up of holding member 46 and orientation adjustment member 48. Holding member 46 is formed using a plate-shaped member extending rearwards from an upper portion on the rear side of main body case 2. Holding groove 47 is formed in a lower edge of holding member 46 so as to hook over held portion 42 from above to thereby hold it. As shown in FIGS. 7 and 8, a whole load of main body case 2 loaded fully with pallets 8 is supported as a result of held portion 42 being held by holding member 46.

Orientation adjustment member 48 is provided below holding member 46 in such a manner as to define a space therebetween. Orientation adjustment member 48 protrudes rearwards from a substantially intermediate height on the rear side of main body case 2. Orientation adjustment member 48 faces eccentric pin 43 from a front thereof. Here, when holding member 46 holds held portion 42, main body case 2 is in such a state that main body case 2 can rotate about held portion 42. As a result, main body case 2 rotates by the action of its own weight until orientation adjustment member 48 is brought into abutment with the outer circumferential surface of eccentric pin 43.

As a result, main body case 2 is oriented so as to be nearly horizontal. In the case that main body case 2 deviates from being nearly horizontal, the operator can adjust the rotational angle of eccentric pin 43 so as to change horizontal distance D, whereby main body case 2 can be adjusted to being horizontal. When the adjustment is finished, the six storage slots of magazine 93 and six replacing slots 3 of main body case 2 are aligned into a straight line. Thus, pallets 8 can move horizontally between the two types of slots, that is, the storage slots and the replacing slots.

3. Method of Using Pallet Replacing Device 1 of First Embodiment

Next, a method of using pallet replacing device 1 of the first embodiment will be described by reference to FIG. 11.

Here, a method of using pallet replacing device 1 of the first embodiment will be described by taking as an example a replacing operation in which a recovery operation and a storing operation of pallets 8 are performed in succession by using one pallet replacing device 1. In addition, target objects of the replacing operation are pallets which are stored in the first to sixth pallets from the top in upper magazine 93 in component supply device 9.

Figure 11:
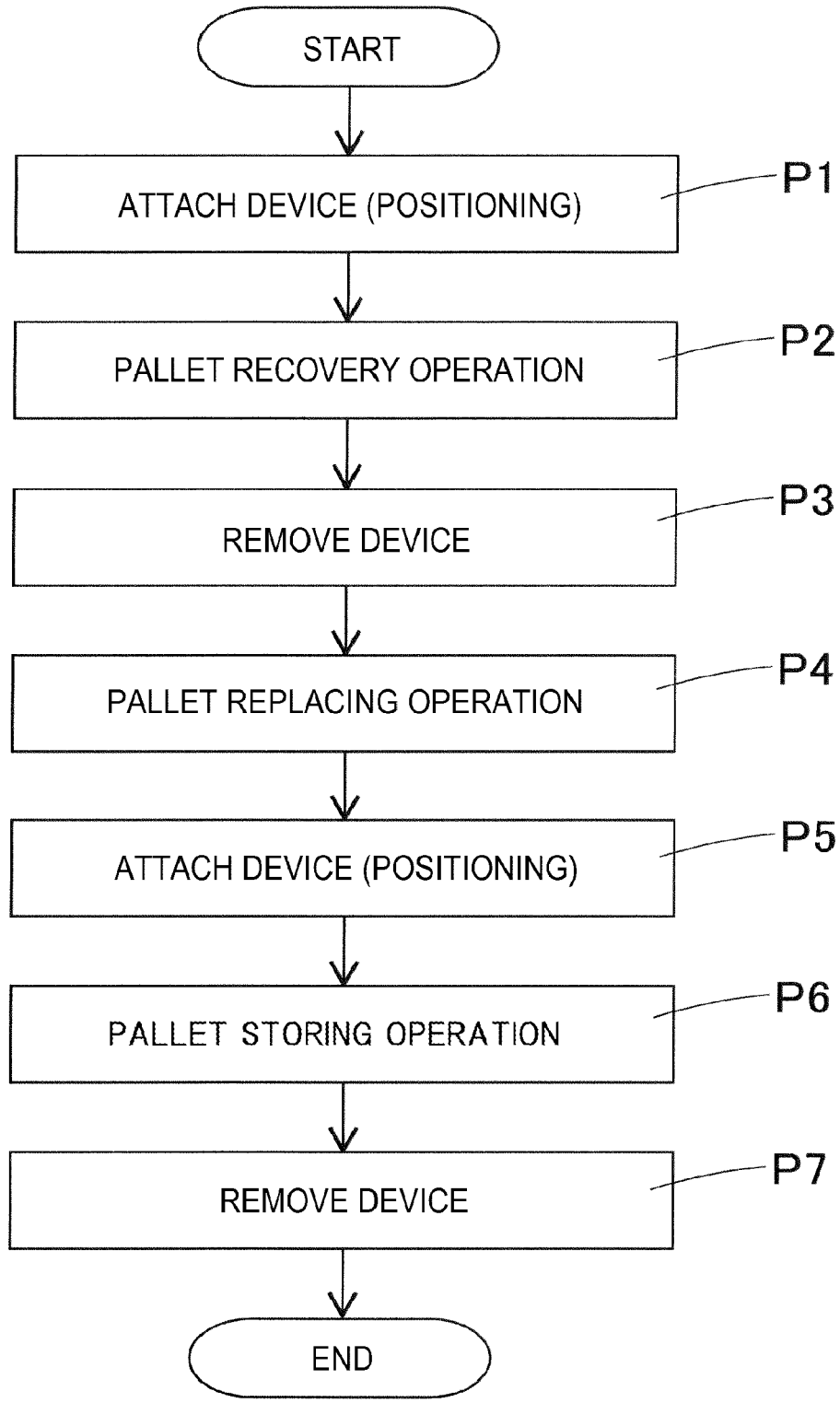
FIG. 11 is a step flowchart illustrating a method for using the pallet replacing device.

The operator performs a preparation operation prior to execution of a flow of steps shown in FIG. 11. That is, the operator sets component supply device 9 to a manual operation mode or a maintenance mode and causes upper magazine 93 to be lifted up to the height position of upper door 922. Further, the operator opens upper door 922. In addition, the operator prepares empty pallet replacing device 1.

In first step P1 in FIG. 11, the operator attaches pallet replacing device 1 to component supply device 9. To describe this in details, the operator lifts up pallet replacing device 1 to a position lying at a front side of opening section 921 of component supply device 9. Subsequently, the operator operates so that holding groove 47 of holding member 46 hooks upper held portion 42 from above to hold it. Next, the operator releases his or her hands from pallet replacing device 1 and confirms whether main body case 2 is now horizontal with orientation adjustment member 48 being in abutment with upper eccentric pin 43.

In the case that main body case 2 deviates from being horizontal, the operator adjusts the rotational angle of eccentric pin 43 to thereby adjust main body case 2 so as to be horizontal. In the case that main body case 2 remains horizontal originally, the adjustment of main body case 2 using eccentric pin 43 becomes unnecessary. As a result of performing first step P1, main body case 2 is positioned in a predetermined position lying rather upwards on the front side of opening section 921 as shown in FIG. 9.

In subsequent second step P2, the operator performs a recovery operation for recovering pallets 8 stored in the first to sixth storage slots from the top in upper magazine 93. To describe this in detail, the operator removes moving tool 5 from tool accommodation section 27 of main body case 2 and grips on gripping portion 51 thereof. Subsequently, the operator advances moving tool 5 rearwards from between right side surface portion 23 and left side surface portion 24, bringing individual hooks 52 into engagement with corresponding locking sections 81 of individual pallets 8 (refer to FIGS. 9, 10). Next, the operator draws back moving tool 5 to the front side and draws out six pallets 8 altogether at one time from the storage slots.

As a result of performing this operation, six pallets 8 are caused to move horizontally from the storage slots into replacing slots 3 at the same time to thereby be recovered. At this point in time, pallet replacing device 1 is fully loaded with pallets 8 which are now stored in all replacing slots 3. Next, the operator returns moving tool 5, which has been so used and in no more use, to tool accommodation section 27 for accommodation therein.

On the other hand, the operator can recover pallets 8 by drawing out them one by one with his or her hands without using moving tool 5. For example, when a small number of pallets 8 fewer than six pallets 8 are stored in some of the first to sixth storage slots, there may be a case in which a recovery of those remaining pallets without moving tool 5 is more efficient than a recovery of the same pallets with moving tool 5, which has to be removed for use from and returned for accommodation to tool accommodation section 27. In addition, when pallets 8 without locking section 81 are used in parallel, at least pallets 8 in question need to be manually drawn out.

In subsequent third step P3, the operator removes pallet replacing device 1 which is fully loaded with pallets 8 from component supply device 9 to transfer that pallet replacing device 1 to a setup work area. In subsequent fourth step P4, the operator performs an exchanging operation of pallets 8 in the setup work area. To describe this in details, the operator removes recovered pallets 8 from pallet replacing device 1 and stores them in a storage position. In addition, the operator stores replacement pallets 8, which will be used next, in replacing slots 3 of pallet replacing device 1.

In subsequent fifth step P5, the operator transfers pallet replacing device 1 which is loaded fully with pallets again from the setup work area and attach it to component supply device 9. Since methods of attachment and positioning are the same as those of first step P1, detailed descriptions thereof will be omitted. In subsequent sixth step P6, the operator performs a storing operation for storing replacement pallets 8 individually in the first to sixth storage slots from the top in upper magazine 93. To describe this in detail, the operator pushes out six pallets 8 residing in replacing slots 3 and moves those six pallets 8 individually into the storage slots of magazine 93. For this, the operator may use spaces defined between hooks 52 of moving tool 5 or may use his or her palm in place of moving tool 5 to move multiple pallets 8 altogether at one time.

In subsequent seventh step P7, the operator removes pallet replacing device 1, which is now empty, from component supply device 9. Thereafter, when another storing operation is performed subsequently for the seventh to twelfth storage slots from the top in upper magazine 93, the operator repeats the flow of steps shown in FIG. 11. In a first step of a second turn of the flow of steps, the operator operates so that holding groove 47 of holding member 46 holds lower held portion 42 and that orientation adjustment member 48 is brought into abutment with lower eccentric pin 43. Hereinafter, the operator repeats the operations of second step P2 to seventh step P7 for the seventh to twelfth storage slots.

A recovery operation and a storing operation for lower magazine 93 will be the same as those for upper magazine 93 described above except that lower door 924 is opened for attachment of pallet replacing device 1. When the recovery operations and storing operations for upper and lower magazines 93 are completed, the operator performs a post-processing operation. That is, the operator closes upper door 922 and lower door 924 and sets component supply device 9 to an automatic operation mode. As a result, component supply device 9 is ready to supply components to a component mounting tool of component mounter 99.

The replacing operation of pallets 8 can be made more efficient by preparing multiple pallet replacing devices 1. In addition, the operator may store pallet replacing device 1 loaded with pallets 8 accommodated therein as it is. This can reduce labor hours required for storing and removing pallets 8 into and from pallet replacing device 1.

With pallet replacing device 1 according to the first embodiment, when positioning section 4 positions main body case 2 in the predetermined position, multiple pallets 8 are allowed to individually move between the storage slots and replacing slots 3. Then, multiple pallets 8 are moved altogether at one time by use of moving tool 5. As a result, the replacement of multiple pallets 8 is efficiently performed. In addition, each pallet 8 merely moves horizontally between the storage slot and replacing slot 3 and never tilts.

This prevents the occurrence of a positional deviation in which components jump out from the component accommodation sections of the tray, whereby the replacement of pallets 8 is performed in an ensured fashion.

In addition, the number of replacing slots 3 of pallet replacing device 1 is made smaller than the number of storage slots of magazines 93, and specifically speaking, the number of replacing slots 3 of pallet replacing device 1 is made a half of the number of storage slots of magazines 93. As a result, with pallet replacing device 1 of the first embodiment, even if pallet replacing device 1 is fully loaded with pallets 8, the weight of pallet replacing device 1 can be reduced remarkably compared with a configuration in which all magazines 93 re replaced at one time. As a result, the load borne by the operator performing the replacing operation is remarkably reduced.

4. Pallet Replacing Device 1A of Second Embodiment

Figure 12:
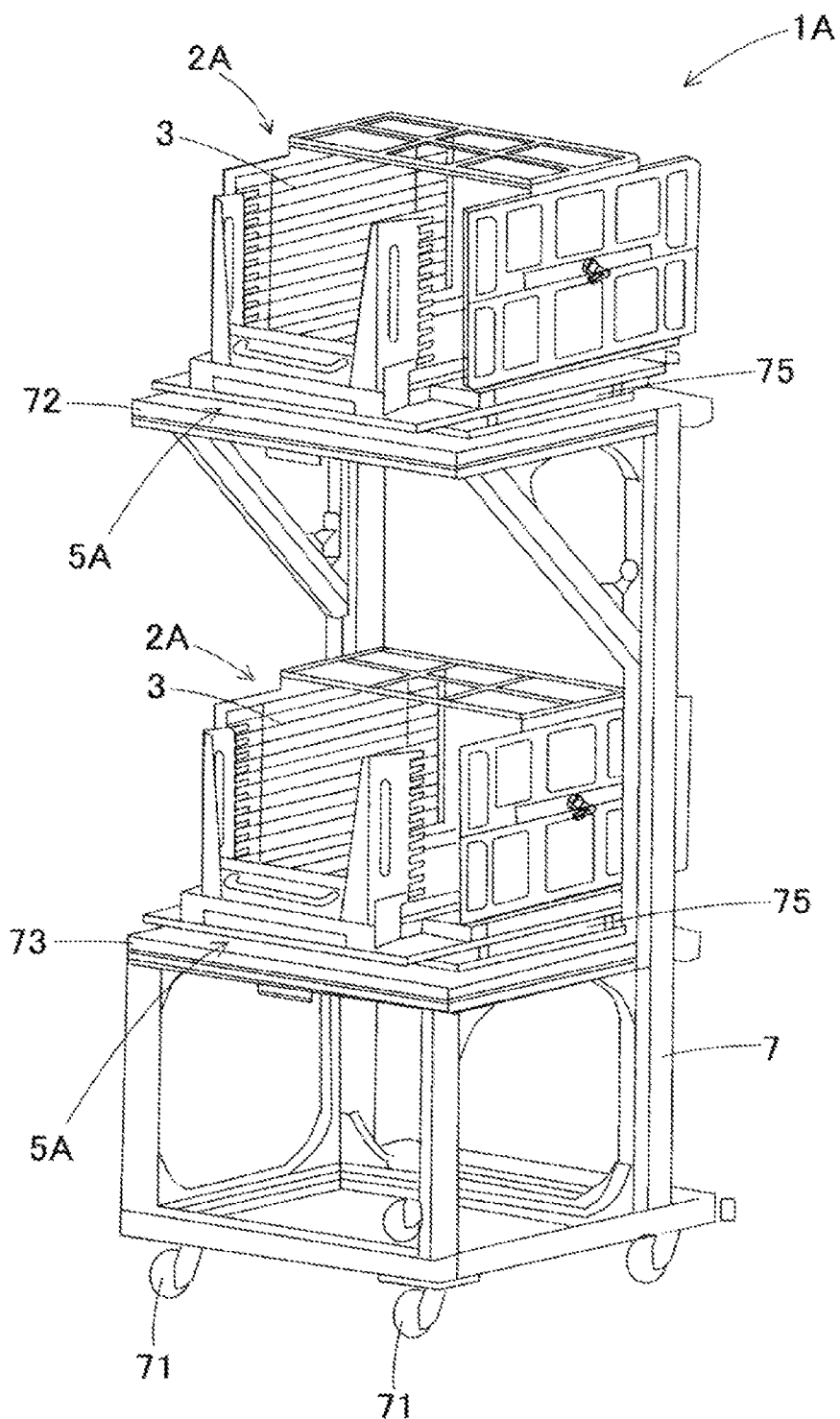
FIG. 12 is a perspective view of a pallet replacing device according to a second embodiment.

Next, referring to FIGS. 12 to 16, pallet replacing device 1A according to a second embodiment will be described mainly as to different features from those of the first embodiment. As shown in FIG. 12, pallet replacing device 1A of the second embodiment is made up of moving body 7, two sets of main body case 2A and height adjusting section 75, 12 replacing slots 3 and moving mechanism 5A which are provided on each main body case 2A, and the like.

Moving body 7 is formed into a vertically long frame-like shape using a rod material or the like. Moving body 7 has four casters 71 on a bottom surface thereof and is configured to be moved manually. That is, moving body 7 takes the form of a bogie configured to be moved towards component supply device 9 in such a state that main body cases 2A are installed therein. Upper plate 72 is supported horizontally at an upper portion of moving body 7. Lower plate 73 is supported horizontally at a lower portion of moving body 7. The height of upper plate 72 substantially coincides with a lower edge of upper door 922 of component supply device 9, and the height of lower plate 73 substantially coincides with a lower edge of lower door 924 of component supply device 9.

Height adjustment section 75 is provided on an upper side of upper plate 72, and main body case 2A is provided on an upper side of height adjustment section 75. Similarly, height adjustment section 75 is provided on an upper side of lower plate 73, and main body case 2A is provided on the upper side of height adjustment section 75. Upper and lower height adjustment sections 75 drive to lift up or lower main body cases 2A, respectively, so as to adjust the heights of main body cases 2A individually and separately. This serves to solve eliminate an influence of a floor height or an influence of an individual difference existing between multiple component supply devices 9.

In the second embodiment, no positioning section 4 made up of attachment seat 41 and attachment portion 45 is used to position main body cases 2A in predetermined positions. Instead, the function of the positioning section is realized by operations of moving body 7 and two height adjustment sections 75. That is, individual main body cases 2A can be positioned in predetermined positions where main body cases 2A are individually square to corresponding magazines 93 by moving moving body 7 to a front side of component supply device 9 and further adjusting two height adjustment sections 75. With this configuration, pallets 8 for two upper and lower magazines 93 can be replaced by performing a replacing operation of pallets 8 once.

Figure 13:
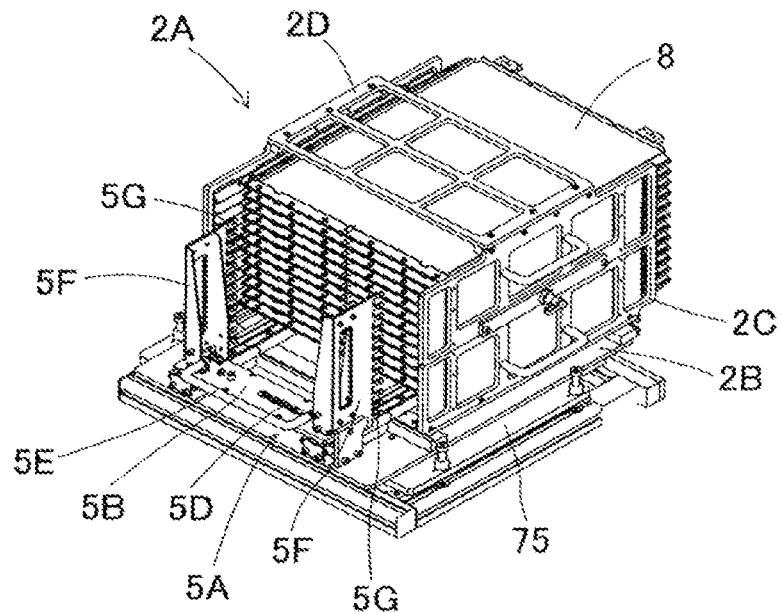
FIG. 13 is a perspective view showing a state in which a case main body is fully loaded with pallets in the second embodiment.
Figure 14:
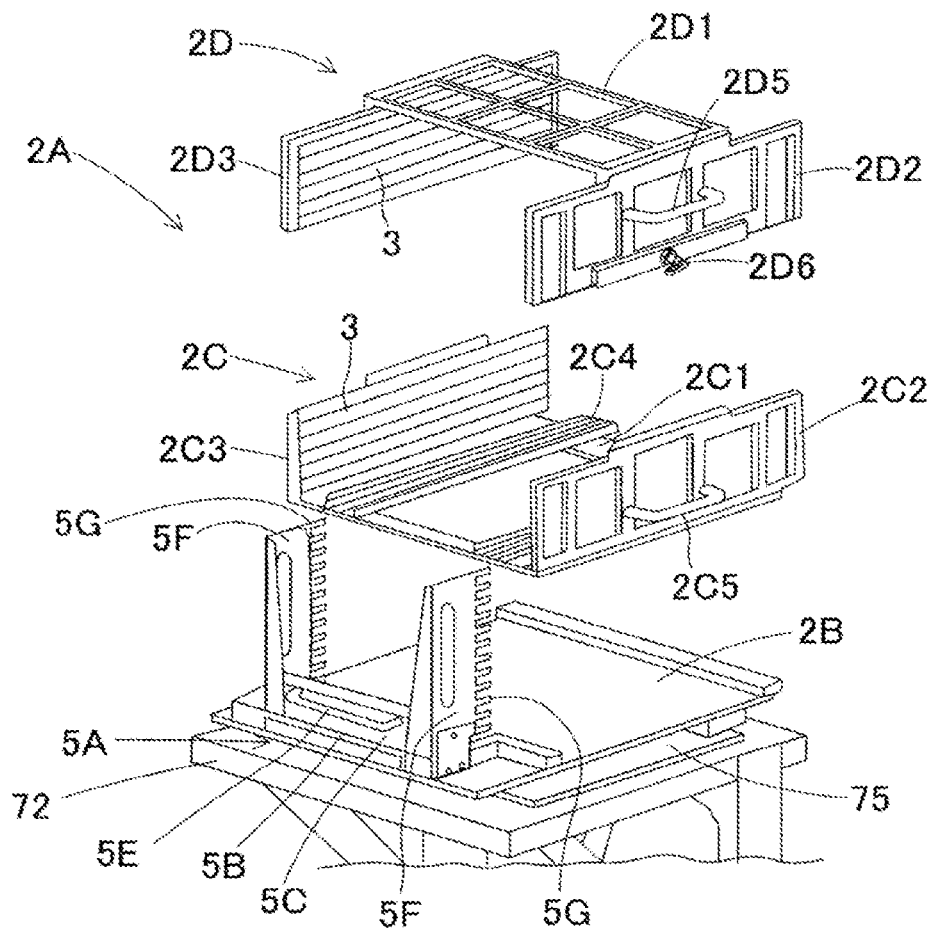
FIG. 14 is an exploded perspective view showing a dividing structure of the main body case in the second embodiment.

Main body case 2A has 12 replacing slots 3 to match the number of storage slots of magazine 93. As in the case with first embodiment, replacing slot 3 is defined by left and right ledge-like portions. FIG. 13 shows a state in main body case 2A is fully loaded with pallets 8 which are stored in all replacing slots 3 thereof. As shown in FIG. 14, main body case 2A can be divided into base 2B, lower small case 2C, and upper small case 2D. Base 2B is supported on an upper side of height adjustment section 75.

Lower small case 2C is attached to and detached from base 2B. Lower small case 2C is made up of bottom portion 2C1, right side surface portion 2C2, and left side surface portion 2C3. Two guide rails 2C4, extending in the front-rear direction, are provided on an upper surface of bottom portion 2C1. Guide rails 2C4 guide moving mechanism 5A when it moves. Six replacing slots 3 are formed on an inner surface of each of right side surface portion 2C2 and left side surface portion 2C3. Handle 2C5 is provided on an outer surface of each of right side surface portion 2C2 and left side surface portion 2C3. A reduction in weight of lower small case 2C is realized by adopting a frame-like shape for bottom portion 2C1, cutting out portions of right side surface portion 2C2 and left side surface portion 2C3, and omitting a top plate portion.

Upper small case 2D is disposed on an upper side of lower small case 2C. Upper small case 2D is made up of top plate portion 2D1, right side surface portion 2D2, and left side surface portion 2D3. Top plate portion 2D1 is formed into a latticed frame-like shape and connects to an upper edge of right side surface portion 2D2 and an upper edge of left side surface portion 2D3. Six replacing slots 3 are formed on an inner surface of each of right side surface portion 2D2 and left side surface portion 2D3. Handle 2D5 is provided on an outer surface of each of right side surface portion 2D2 and left side surface portion 2D3. Coupling lever 2D6 is provided below handle 2D5. Upper small case 2D is attached to and detached from lower small case 2C by operating coupling lever 2D6. A reduction in weight of upper small case 2D is realized by adopting the latticed frame-like shape for top plate portion 2D1, cutting out portions of right surface portion 2D2 and left side surface portion 2D3, and omitting a bottom portion.

Moving mechanism 5A is a mechanism for manually performing a batch moving operation for moving multiple pallets 8 altogether at one time between the storage slots and replacing slots 3. Moving mechanism 5A is made up of longitudinal moving section 5B, transverse moving section 5C, biasing spring 5D, left and right hook holding bodies 5F, 12 hooks 5G provided on each of left and right hook holding bodies 5F, and the like. In FIG. 13, transverse moving section 5C is omitted for the purpose of clearly showing biasing spring 5D.

Longitudinal moving section 5B is formed long in the left-right direction. Longitudinal moving section 5B is normally disposed at a front portion of base 2B in a detachable fashion. Longitudinal moving section 5B rides on guide rails 2C4 on lower small case 2C when in operation and moves along guide rails 2C4 in the front-rear direction. Biasing spring 5D is disposed inside a hole provided in the vicinity of a center of longitudinal moving section 5B. Transverse moving section 5C is disposed on an upper side of longitudinal moving section 5B and is supported so as to move in the left-right direction with respect to longitudinal moving section 5B. Handle 5E is provided on a front surface of transverse moving section 5C. Transverse moving section 5C is normally positioned in a right normal position by means of the action of biasing spring 5D.

Left and right hook holding bodies 5F are provided integrally at the right and left of transverse moving section 5C. Hook holding body 5F is a plate-shaped member which extends upwards and rearwards. 12 hooks 5G, extending rearwards, are provided at a rear portion of hook holding body 5F. Vertical intervals at which 12 hooks 5g are disposed coincides with the intervals at which pallets 8 are disposed within magazine 93. Hook portion 5H, which is bent downwards, is provided at a rear end of hook 5G (refer to FIGS. 15, 16). Hook portions 5H of 12 hooks 5G can individually engage with locking sections 81 of 12 pallets 8 at the same time.

5. Method of Using Pallet Replacing Device 1A of Second Embodiment

Next, a method of using pallet replacing device 1A of the second embodiment will be described. Here, the method will be described by taking as an example an operation for recovering pallets 8 using upper main body case 2A. Target objects of the recovery operation constitute all the pallets accommodated in upper magazine 93 of component supply device 9.

In a preparatory operation, the operator sets component supply device 9 to a manual operation mode or a maintenance mode and causes upper magazine 93 to be lifted up to a height position of upper door 922. Further, the operator opens upper door 922. In addition, the operator sets main body case 2A, which is empty, on upper height adjustment section 75 of moving body 7. Next, the operator moves moving body 7 to the front side of component supply device 9 and adjusts height adjustment section 75 so as to cause main body case 2A to be square to magazine 93.

Figure 15:
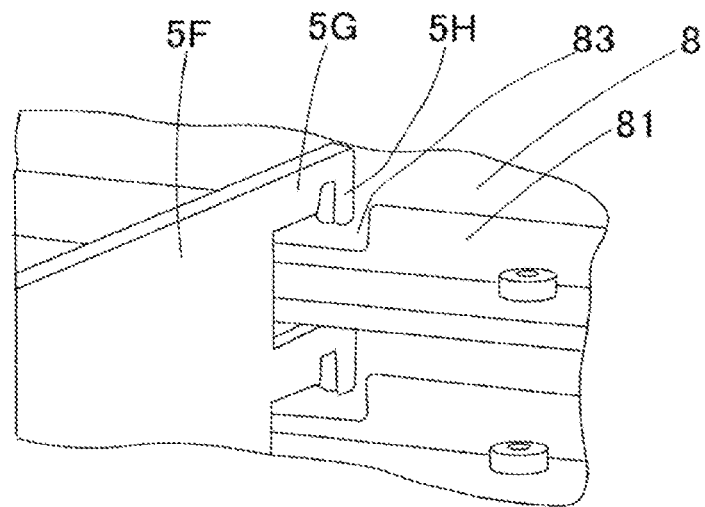
FIG. 15 is a perspective view showing a state in which hooks of a moving mechanism are operated to a leftward operating position in the second embodiment.
Figure 16:
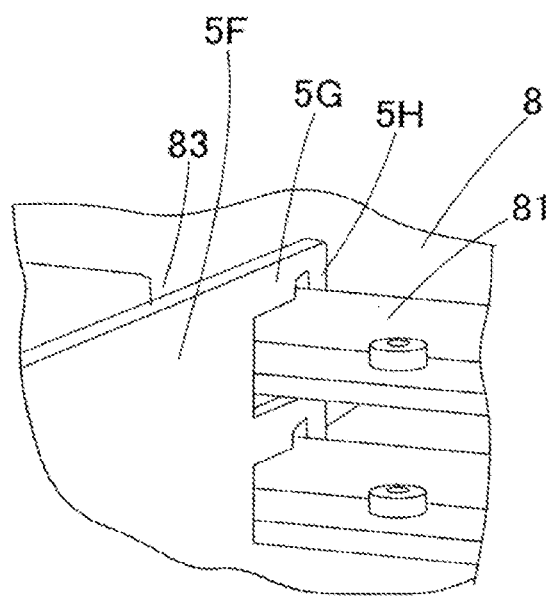
FIG. 16 is a perspective view showing a state in which the hooks of the moving mechanism return to a rightward normal position where the hooks are in engagement with engagement portions of pallets in the second embodiment.

Subsequently, the operator grips on handle 5E of moving mechanism 5A to advance the whole of moving mechanism 5A to the rear along guide rails 2C4. The operator operates handle 5E to the left against the biasing force of biasing spring 5D before hooks 5G come into abutment with corresponding locking sections 81 of pallets 8. As a result of this operation, transverse moving section 5C and left and right hook holding bodies 5F move together to the left. As this occurs, as shown in FIG. 15, hooks 5G in operating positions become square to passage portions 83, which are each formed somewhere in locking section 81 in the left-right direction thereof.

The operator further advances the whole of moving mechanism 5A to the rear. Then, the operator operates handle 5E to the right or releases his or her hand from handle 5E after hook portions 5H of hooks 5G have passed through corresponding passage portions 83. Then, transverse moving section 5C and left and right hook holding bodies 5F automatically move to the right by means of the biasing force of biasing spring 5D. As this occurs, hook portions 5H of hooks 5G, which are now in normal positions, enter rear sides of perpendicular portions of locking sections 81 to thereby be brought into engagement with locking sections 81. Subsequently, the operator pulls handle 5E towards him or her to draw back the whole of moving mechanism 5A to the front side.

As a result of this operation, 12 pallets 8 move horizontally from the storage slots to replacing slots 3 at the same time, whereby pallets 8 are recovered altogether at one time. At this point in time, main body case 2A is fully loaded with pallets 8 which are now stored in all replacing slots 3. Thereafter, the operator performs an operation for removing pallets 8 from main body case 2A. There are three methods in performing the removing operation of pallets 8. That is, there are a first method of dividing main body case 2A, a second method of removing moving mechanism 5A, and a third method of moving moving body 7.

In the first method, the operator operates to release coupling lever 2D6 so as to remove upper small case 2D and further removes lower small case 2C from base 2B. Thereafter, the operator removes pallets 8 from each of lower small case 2C and upper small case 2D. The first method can be performed with moving body 7 left at the front side of component supply device 9. In addition, lower small case 2C and upper small case 2D are light remarkably in weight compared with magazine 93 which is fully loaded with pallets. Accordingly, with the first method, the load of the operator is remarkably reduced compared with a method for replacing the whole of magazine 93.

In the second method, the operator removes the whole of moving mechanism 5A or a part of moving mechanism 5A excluding longitudinal moving section 5B from base 2B. Then, all pallets 8 in main body case 2A can be taken out to the front side. The second method can be performed with moving body 7 left at the front side of component supply device 9. Further, with the second method, there is caused no need to divide main body case 2A.

In the third method, the operator moves moving body 7 from the front side of component supply device 9. Then, all pallets 8 within main body case 2A can be taken out to a rear side. With the third method, main body case 2A does not have to be divided, and moving mechanism 5A also does not have to be removed. However, moving body 7 needs to be moved again before another replacing operation is performed.

The three methods described above are selected as required in consideration of the number of magazines 93 and pallets 8 to be used, a limitation imposed on a work area for removal of pallets 8 from main body case 2A, and the like. The first method, second method, and third method can also be applied to a storing operation for storing pallets 8 in main body case 2A. Further, when storing multiple pallets 8 from main body case 2A into magazine 93, the operator can advance moving mechanism 5A to the rear for performing a batch storing operation without moving transverse moving section 5C in the left-right direction.

With pallet replacing device 1A of the second embodiment, multiple pallets 8 are moved altogether at one time by use of moving mechanism 5A. As a result, the replacement of multiple pallets 8 is efficiently performed. In addition, each pallet 8 merely moves horizontally between the storage slot and replacing slot 3 and never tilts. As a result, a positional deviation of a component is prevented, whereby pallets 8 are replaced in an ensured fashion. In addition, with the first method of removing pallets 8 by dividing main body case 2A, the load on the operator is remarkably reduced as compared with the method of replacing the whole of magazine 93.

6. Applications and Modifications of Embodiments

In the first embodiment, moving mechanism 5A of the second embodiment can be used in place of moving tool 5. On the contrary, in the second embodiment, moving tool 5 of the first embodiment can be used in place of moving mechanism 5A. Holding mechanism 6 of the first embodiment can be provided on main body case 2A of the second embodiment. Further, positioning section 4 of the first embodiment can be modified in various manners. For example, a configuration may be adopted in which attachment portion 45 on main body case 2 is made up of a held portion and orientation adjustment member 48, and attachment seat 41 of component supply device 9 is made up of a holding member configured to hook the held portion from below to hold it and eccentric pin 43. In the second embodiment, only one set of main body case 2A and height adjustment section 75 may be provided.

In the first embodiment, the number of replacing slots 3 of main body case 2 is not limited to six. For example, four replacing slots 3 are provided, and the replacing operation is made to be performed or repeated three times on magazine 93, whereby the weight of pallet replacing device 1 can be reduced further. In addition, even if the number of replacing slots 3 is eight, an advantage in reducing the weight of pallet replacing device 1 is still provided compared with the configuration in which the whole of magazine 93 is replaced. In this aspect, for example, pallets 8 having a high component consumption rate are stored in the fifth to eighth storage slots from the top in magazine 93, and pallet replacing device 1 is configured to operate alternately for the first to eighth storage slots and the fifth to twelfth storage slots.

On the other hand, in the second embodiment, main body case 2A can be made up by combination of three or more small cases. In this aspect, with the first method of dividing main body case 2A to remove pallets 8, the load on the operator is further reduced. In addition, in the second embodiment, moving body 7 and moving mechanism 5A can be configured to operate automatically by adopting an unmanned conveyance vehicle which runs automatically for moving body 7 and adding an actuator or the like to moving mechanism 5A. With this configuration, the replacement of pallets 8 can be performed completely automatically. Other various applications and modifications can be made to the first and second embodiments.

REFERENCE SIGNS LIST

1, 1A: pallet replacing device, 2, 2A: main body case, 25: ledge-like portion, 27: tool accommodation member, 2B: base, 2C: lower small case, 2D: upper small case, 3: replacing slot, 4: positioning section, 41: attachment seat, 42: held portion, 43: eccentric pin, 45: attachment portion, 46: holding member, 48: orientation adjustment member, 5: moving tool, 52: hook, 5A: moving mechanism, 5B: longitudinal moving section, 5C: transverse moving section, 5F: hook holding body, 5G: hook, 6: holding mechanism, 7: moving body, 75: height adjustment section, 8: pallet, 81: locking section, 9: component supply device, 93: magazine.

The invention claimed is:

1. A pallet replacing device configured to be applied to a component supply device in which pallets, each holding components, are individually stored in multiple storage slots which are formed at predetermined heightward intervals inside a magazine, and the pallets are selectively drawn out to supply the components, the pallet replacing device, comprising:
    a main body case;
    multiple replacing slots formed at the predetermined heightward intervals inside the main body case and configured to store the pallets therein;
    a positioning section configured to position the main body case in a predetermined position where the multiple pallets can individually move between the storage slots and the replacing slots; and
    a moving tool configured to be used for a batch moving operation for moving the multiple pallets altogether at one time between the storage slots and the replacing slots,
    wherein the positioning section is made up of an attachment seat provided on the component supply device and an attachment portion provided on the main body case, and the main body case is positioned in the predetermined position as a result of the attachment portion being attached to the attachment seat,
    wherein one of the attachment seat and the attachment portion is a held portion,
    wherein a remainder of the attachment seat and the attachment portion is a holding member configured to hook the held portion to hold the held portion, and
    wherein the attachment seat includes the held portion provided at a front side of the component supply device and an eccentric pin provided on a lower side of the held portion of the component supply device and configured to adjust a rotational angle thereof.

2. The pallet replacing device according to claim 1, wherein the moving tool has multiple hooks configured to be brought into engagement with locking sections provided individually on the multiple pallets so as to draw out the multiple pallets altogether at one time from the storage slots.

3. The pallet replacing device according to claim 1, wherein the main body case has a tool accommodation section configured to accommodate the moving tool.

4. The pallet replacing device according to claim 1, wherein the main body case has a holding mechanism configured to hold the pallets stored in the replacing slots so as to restrict the pallets from being drawn out from the replacing slots.

5. The pallet replacing device according to claim 1, wherein the attachment portion includes the holding member provided at a rear side of the main body case and an orientation adjustment member provided on a lower side of the holding member of the main body case and configured to be brought into abutment with an outer circumferential surface of the eccentric pin from a front thereof, and
    wherein the main body case, which is to be positioned, can be adjusted to a horizontal state by adjusting the rotational angle of the eccentric pin.

6. The pallet replacing device according to claim 1, wherein a number of the replacing slots is smaller than a number of the storage slots.

7. The pallet replacing device according to claim 6, wherein the number of the replacing slots is a half of the number of the storage slots.

8. The pallet replacing device according to claim 1, further comprising:
    a moving body capable of moving towards the component supply device with the main body case mounted; and
    a height adjustment portion provided on the moving body and configured to lift up or lower the main body case,
    wherein the positioning section positions the main body case in the predetermined position through operations of the moving body and the height adjustment portion.

9. The pallet replacing device according to claim 8, wherein the moving body is a wheeled table configured to move manually.

10. The pallet replacing device according to claim 8, wherein the moving body is an unmanned conveyance vehicle configured to move automatically.

11. The pallet replacing device according to claim 8,
wherein a number of the replacing slots is equal to a number of the storage slots, and
wherein the main body case is configured not only to be divided into multiple small cases each comprising the replacing slot or slots formed thereon but also to be detachably attached to the height adjustment portion.

12. The pallet replacing device according to claim 1,
wherein the pallet
has multiple component accommodation sections each configured to accommodate and
hold the component therein, or holds a tray comprising multiple component accommodation sections each configured to accommodate the component therein or an expandable sheet to an upper surface of which the multiple components are affixed and which can expand and contract.

13. A pallet replacing device configured to be applied to a component supply device in which pallets, each holding components, are individually stored in multiple storage slots which are formed at predetermined heightward intervals inside a magazine, and the pallets are selectively drawn out to supply the components by a draw-out mechanism, the pallet replacing device, comprising:
a main body case;
multiple replacing slots formed at the predetermined heightward intervals inside the main body case and configured to store the pallets therein;
a positioning section configured to position the main body case in a predetermined position where the multiple pallets can individually move between the storage slots and the replacing slots; and
a moving tool configured to be used for a batch moving operation for moving the multiple pallets altogether at one time between the storage slots and the replacing slots by drawing out the pallets from the storage slots to the opposite side of the draw-out mechanism,
wherein the moving tool presents a rectangular frame-like shape, a front portion of the moving tool includes a gripping portion configured to be gripped by an operator, and a rear portion of the moving tool includes multiple hooks extending rearward and being disposed at intervals in a vertical direction, a rear end of each of the hooks including a hooking portion bent downwards and configured to be brought into engagement with rear sides of perpendicular portions of locking sections provided individually on the multiple pallets so as to draw out the multiple pallets altogether at one time from the storage slots.

14. A pallet replacing device configured to be applied to a component supply device in which pallets, each holding components, are individually stored in multiple storage slots which are formed at predetermined heightward intervals inside a magazine, and the pallets are selectively drawn out to supply the components by a draw-out mechanism, the pallet replacing device, comprising:
a main body case;
multiple replacing slots formed at the predetermined heightward intervals inside the main body case and configured to store the pallets therein;
a positioning section configured to position the main body case in a predetermined position where the multiple pallets can individually move between the storage slots and the replacing slots; and
a moving mechanism configured to execute manually or automatically a batch moving operation for moving the multiple pallets altogether at one time between the storage slots and the replacing slots by drawing out the pallets from the storage slots to the opposite side of the draw-out mechanism,
wherein the moving mechanism includes hooks extending rearward and being disposed at intervals in a vertical direction, each of the hooks including a hook portion, the hook portions configured to be brought into engagement with locking sections provided individually on the multiple pallets so as to draw out the multiple pallets altogether at one time from the storage slots.

15. A pallet replacing device configured to be applied to a component supply device in which pallets, each holding components, are individually stored in multiple storage slots which are formed at predetermined heightward intervals inside a magazine, and the pallets are selectively drawn out to supply the components, the pallet replacing device, comprising:
a main body case;
multiple replacing slots formed at the predetermined heightward intervals inside the main body case and configured to store the pallets therein;
a positioning section configured to position the main body case in a predetermined position where the multiple pallets can individually move between the storage slots and the replacing slots; and
a moving mechanism configured to execute manually or automatically a batch moving operation for moving the multiple pallets altogether at one time between the storage slots and the replacing slots,
wherein the moving mechanism includes a longitudinal moving section, a transverse moving section disposed on an upper side of the longitudinal moving section, a biasing spring disposed inside a hole provided in a vicinity of a center of the longitudinal moving section, first and second hook holding bodies provided integrally at first and second ends of the transverse moving section and extending vertically, and hooks provided on each of the first and second hook holding bodies.

* * * * *